(12) United States Patent
Ro et al.

(10) Patent No.: US 7,449,397 B2
(45) Date of Patent: Nov. 11, 2008

(54) METHOD FOR ANNEALING SILICON THIN FILMS AND POLYCRYSTALLINE SILICON THIN FILMS PREPARED THEREFROM

(75) Inventors: Jae-Sang Ro, 105-301, Samsung River Sweet Apt., Dongbuichon-dong, Yongsan-gu, Seoul 140-720 (KR); Won-Eui Hong, Seoul (KR)

(73) Assignee: Jae-Sang Ro (KR)

( * ) Notice: Subject to any disclaimer, the term of this patent is extended or adjusted under 35 U.S.C. 154(b) by 0 days.

(21) Appl. No.: 10/558,511

(22) PCT Filed: May 27, 2004

(86) PCT No.: PCT/KR2004/001252
§ 371 (c)(1),
(2), (4) Date: Dec. 6, 2006

(87) PCT Pub. No.: WO2004/107453
PCT Pub. Date: Dec. 9, 2004

(65) Prior Publication Data
US 2007/0099352 A1    May 3, 2007

(30) Foreign Application Priority Data
May 27, 2003   (KR)  ............... 10-2003-0033870

(51) Int. Cl.
*H01L 21/20* (2006.01)
*H01L 21/36* (2006.01)
(52) U.S. Cl. ............... 438/479; 438/100; 438/101
(58) Field of Classification Search .......... 438/100, 438/101, 663, 710, 719, 720, 473
See application file for complete search history.

(56) References Cited

U.S. PATENT DOCUMENTS 6,326,226 B1   12/2001   Jang et al. ............. 438/48 C
6,500,736 B2 *  12/2002   Kim et al. ............... 438/486
6,531,348 B2 *   3/2003   Kim et al. ............... 438/166
7,183,145 B2 *   2/2007   Tanaka et al. ........... 438/149

FOREIGN PATENT DOCUMENTS

| KR | 1020000031709 A | 6/2000 |
| KR | 1020010054935 A | 7/2001 |
| KR | 1020020054171 A | 7/2002 |
| KR | 1020030005911 A | 1/2003 |

OTHER PUBLICATIONS

PCT International Search Report; PCT/KR2004/001252; Date: Dec. 21, 2004.

* cited by examiner

*Primary Examiner*—Walter L. Lindsay, Jr.
*Assistant Examiner*—Kenisha V Ford
(74) *Attorney, Agent, or Firm*—Cantor Colburn LLP (57) ABSTRACT

Disclosed is a method for annealing a silicon thin film in a substrate in which an insulation layer and the silicon thin film are subsequently formed. The method includes heating or preheating the silicon thin film within a temperature range at which the substrate is not transformed during the process so as to generate an intrinsic carrier therein, thereby lowering a resistance to a value at which Joule heating is possible; and applying an electric field to the preheated silicon thin film so as to induce Joule heating by means of movement of the carrier, thereby conducting crystallization, eliminating crystal defects, and ensuring crystal growth. When using the method, Joule heating is selectively induced to a-Si thin film, a-Si/Poly-Si thin film or a Poly-Si thin film according to the preheating condition, thereby making a Poly-Si thin film of good quality within a very short time without damaging the substrate.

13 Claims, 10 Drawing Sheets

RMS roughness : ~38 Å

RMS roughness ~224 Å

METHOD FOR ANNEALING SILICON THIN FILMS AND POLYCRYSTALLINE SILICON THIN FILMS PREPARED THEREFROM

BACKGROUND OF THE INVENTION

1. Field of the Invention

The present invention relates to a method for annealing silicon thin films and polycrystalline silicon thin films prepared using the method. More particularly, the present invention relates to a method for annealing silicon thin films, which, in a substrate on which an insulation layer and a silicon film are subsequently formed, preheats the silicon film in a temperature range where the substrate is not transformed during the process in order to generate an intrinsic carrier therein so that a resistance is lowered to a value enabling Joule heating, applies an electric field to the preheated silicon film in order to induce Joule heating by means of movement of the carrier, resulting in crystallization, removal of crystal lattice defects, and crystal growth, and also relates to polycrystalline silicon thin films of good quality, prepared using the method.

2. Description of the Related Art

Generally, amorphous silicon (a-Si) has some disadvantages such as low aperture and poor mobility of electrons acting as charge carriers, and it is also not in accordance with the CMOS procedure. Meanwhile, a polycrystalline silicon (Poly-Si) thin film element is capable of configuring a driving circuit required for writing an image signal to a pixel on a substrate like a pixel TFT-array, which was impossible with a-Si TFT. Thus, Poly-Si thin film element does not require connection between a plurality of terminals and a driver IC, thereby improving productivity and reliability and reducing thickness of a panel. In addition, the poly-Si TFT process may form micro structures on wires or the like since it may use the micro structuring process of silicon LSI as it is. Thus, since there is no limitation in pitch on TAB mounting of the driver IC, which exists in a-Si TFT, pixel reduction is easy and many pixels may be implemented in a small angle of view. When compared with a thin film transistor using a-Si, a thin film transistor using Poly-Si in an active layer has excellent switching ability and enables miniaturization to be converted into CMOS since a channel location of the active layer is determined by self-matching. For such reasons, the Poly-Si thin film transistor is used as a pixel switching element of an active matrix-type flat panel display (e.g., an LCD or an organic EL) and is an influential element for a large screen display and for practically implementing a driver-mounted COG (Chip On Glass).

Such a Poly-Si TFT may be manufactured under either high temperature condition or low temperature condition. For the high temperature condition, an expensive material such as quartz should be used for the substrate, so the method is not suitable for enlarging a screen size. Thus, research is mainly focused on the method for mass-producing a-Si thin films into Poly-Si under a low temperature condition.

To make Poly-Si at low temperature, there are used SPC (Solid Phase Crystallization), MIC (Metal Induced Crystallization), MELC (Metal Induced Lateral Crystallization), ELC (Excimer Laser Crystallization) and so on.

SPC requires high crystallization temperature and long processing time, though it may obtain uniform crystal structure with inexpensive equipments. Thus, SPC cannot use a substrate such as a glass substrate which experiences heat distortion at low temperature, and it has low productivity. In SPC, crystallization is possible when a-Si thin film is annealed for 1 to 24 hours at 600 to 700° C. In addition, the Poly-Si produced by SPC has many crystal lattice defects in the formed crystal grain since it accompanies twinning-growth when being changed from an amorphous state to a crystalline solid state. Such factors cause decrease of mobility of holes and electrons of the produced Poly-Si TFT and increase of threshold voltage.

MIC has an advantage that crystallization is accomplished at a far lower temperature than the case of SPC since a-Si is contacted with a specific metal. The metal for MIC may be Ni, Pd, Ti, Al, Ag, Au, Co, Cu, Fe, Mn and so on, and these metals are reacted with a-Si to form eutectic phase or silicide phase, thereby promoting low temperature crystallization. However, in case MIC is applied to the actual process of Poly-Si TFT manufacture, it causes serious contamination to metals in a channel.

MILC is an application of MIC. MILC forms a gate electrode instead of deposition of metal on the channel, deposits a thin metal layer coating on source and drain thinly in the self-aligned structure to cause metal induced crystallization, and then induces side crystallization toward the channel. Ni and Pd are the most frequently used metals in MILC. The Poly-Si manufactured by MILC shows excellent crystallinity and high field effect mobility compared with that of SPC, but it disadvantageously shows a high leakage current feature. That is to say, the metal contamination problem is not completely solved, though it is decreased to some extent compared with MIC. Meanwhile, as an improvement of MILC, there is used FALC (Field Aided Lateral Crystallization). FALC gives faster crystallization rate and shows anisotropy of crystal orientation, but it also does not completely solve the metal contamination problem.

The aforementioned crystallization methods such as MIC, MILC and FALC are effective in the point that the crystallization temperature is lowered, but they have a common feature that crystallization is induced by metal. Thus, they are not free from the metal contamination problem. As revealed, in case Cu is used as the metal, a pollution level measured at the center of the channel is 2.1% in MIC, 0.3% in MILC, and 0.11% in FALC.

Meanwhile, ELC, recently developed, enables preparation of Poly-Si thin film on a glass substrate by a low temperature process together with solving the metal contamination problem. A-Si thin film deposited using LPCVD (Low Pressure Chemical Vapor Deposition) or PECVD (Plasma Enhanced Chemical Vapor Deposition) has a very large absorption coefficient against an ultraviolet region ($\lambda$=308 nm) which corresponds to the wavelength of Excimer laser, so the a-Si thin film is apt to be easily melted at a suitable energy density. In case of crystallizing the a-Si thin film with an Excimer laser, melting and congelation are accompanied within a very short time. In this aspect, ELC is not a low temperature process in the strict sense. However, ELC may produce Poly-Si within an extremely short time (several ten nano-seconds) without damaging a substrate, since crystallization is accomplished by melting and congelation occurring very rapidly in a local melting area affected by Excimer laser. That is to say, if a laser is irradiated on a-Si of a preform composed of glass substrate/insulation layer/a-Si thin film, only the a-Si thin film is selectively heated, thereby being crystallized without damage of the glass substrate positioned below. In addition, in case of Poly-Si which is generated during phase shift from liquid to solid, it shows more stable crystal grain structure and shows remarkably reduced crystal defects in the crystal grain compared to Poly-Si generated through solid crystallization. Thus, Poly-Si manufactured using ELC is superior to any other product of other crystallization methods.

In spite of that, ELC has several serious drawbacks. For example, there is a problem of a laser system in the radiant heat of a laser beam itself, a problem of a laser process that a process region is extremely limited, and a problem that a shot scratch remains on a large-size substrate. Such factors cause irregularity of crystal grain size of the Poly-Si thin film which composes an active layer of Poly-Si TFT. In addition, since Poly-Si generated together with a phase shift from liquid to solid accompanies volume expansion, serious protrusions form toward a surface from a point where crystal boundaries are made. This phenomenon has direct influence on the gate insulation layer which is a post-process, and particularly exerts a serious effect on the reliability such as hot carrier stress caused by irregular morphology of the interface between Poly-Si and the gate insulation layer.

In recent, SLS (Sequential Lateral Solidification) is developed to solve instability of the aforementioned ELC, and successfully stabilizes a process region of a laser energy density. However, it still does not solve the problems of shot scratch and protrusions. In addition, seeing the current trend that the flat display industry is growing quickly, the technique using laser to control a crystallization process of a substrate with a size more than 1 m×1 m which is to be mass-produced eventually still has problems. Furthermore, ELC and SLS has another problem that great investment is required initially and maintenance cost are high since they require very expensive equipments.

SUMMARY OF THE INVENTION

Thus, there is required a crystallization method of a-Si thin film, which solves drawbacks of a laser crystallization method, namely irregularity of the radiation supply according to a local process and requirement for expensive equipments, as well as possesses advantages of the laser crystallization method, namely not damaging a substrate at a lower position since the process is accomplished within a very short time and generating a crystal grain of good quality with a large size and substantially no defects owing to high temperature phase shift. In particular, in case of the AMOLED (Active Matrix Organic Light Emitting Diode), which is attracting attention in applications of a post-generation flat plate display, uses a current-operating manner, while TFT-LCD uses a voltage-operating manner, so the regularity of crystal grain size is a very essential factor in the large-size substrate. Thus, as a matter of fact, the low temperature crystallization method using ELC or SLS is only limited applied in the flat plate industry. Considering such facts, there is a urgent need for a new technique to manufacture a Poly-Si thin film of good quality by means of low temperature crystallization using a non-laser manner.

The present invention is designed to solve the problems of the prior art and technical goals having been demanded in the art by one effort.

Specifically, an object of the present invention is to provide a method for conducting crystallization, eliminating lattice defects and ensuring crystal growth within a very short time without damaging a substrate in which an insulation layer and an amorphous silicon (a-Si) thin film are subsequently formed, by heating the a-Si thin film within a temperature range not transforming the substrate during the process to generate an intrinsic carrier therein, preferably progressing solid phase crystallization partially or entirely at the same time, and then lowering an electric resistance and applying an electric field to move the thermally generated carrier, thereby inducing selective Joule heating only on a-Si thin film, a-Si/Poly-Si (polycrystalline silicon) mixture thin film, or Poly-Si thin film.

Another object of the present invention is to provide a Poly-silicon thin film of good quality, obtained by the crystallization method.

In order to accomplish the above object, the present invention provides a method for annealing a silicon thin film in a substrate in which an insulation layer and the silicon thin film are subsequently formed, which includes the steps of: heating or preheating the silicon thin film within a temperature range at which the substrate is not transformed during the process so as to generate an intrinsic carrier therein, thereby lowering a resistance to a value at which Joule heating is possible; and applying an electric field to the preheated silicon thin film so as to induce Joule heating by means of movement of the carrier, thereby conducting crystallization, removal of crystal defects, and crystal growth.

The silicon thin film may be an amorphous silicon (a-Si) thin film, an amorphous/polycrystalline silicon thin film, or a polycrystalline silicon (Poly-Si) thin film, or a doped polycrystalline silicon thin film.

In case of preheating an a-Si thin film according to the method of the present invention, together with generating the intrinsic carrier, solid crystallization of the a-Si thin film may be conducted partially or entirely according to preheating temperature and time. Thus, in the step before applying an electric field, the a-Si thin film may exist in an amorphous state, amorphous/polycrystalline mixture state, or a polycrystalline state with being preheated. In addition, by means of application of the electric field, Joule heating is selectively induced in such a silicon thin film, thereby conducting crystallization, eliminating crystal lattice defects, and ensuring crystal growth within a very short time without damaging the substrate.

Figure 1:
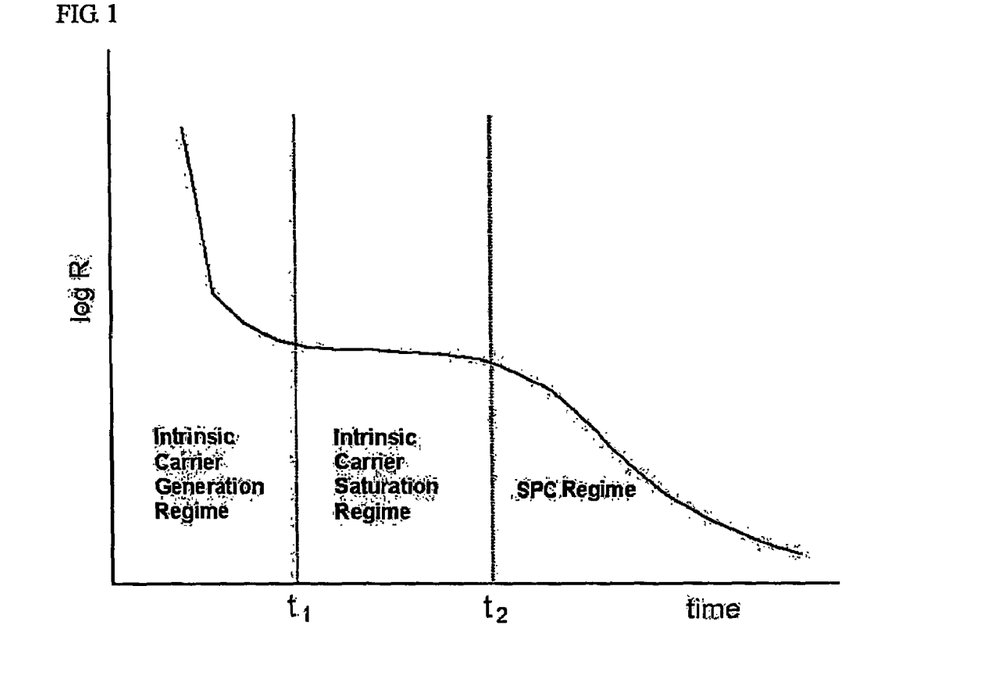
FIG. 1 is a graph showing a change of electric resistance according to a heating time of an amorphous silicon (a-Si) thin film.

Since amorphous silicon has a high resistance value at a room temperature, it is impossible to achieve Joule heating by means of application of an electric field. However, if an a-Si thin film is heated at a temperature in a certain range according to the method of the present invention, an intrinsic carrier is generated in the thin film at an initial stage of heating as shown in FIG. 1, so an electric resistance value of the thin film is lowered.

If a heating time is increased to reach a first threshold time $t_1$, an electric resistance of the thin film comes to a certain value $R_1$, thereby being saturated. That is to say, concentration of the intrinsic carrier at the corresponding temperature reaches a thermal equilibrium. After that, though a heating time is increased, an electric resistance of the thin film is substantially unchanged. If a heating time is further increased to reach a second threshold time $t_2$, an electric resistance of the thin film is again lowered. That is to say, solid crystallization of the a-Si thin film is progressed, thereby being phase-shifted into polycrystalline silicon. After that, with time, the resistance of the thin film is slowly decreased without interruption. Thus, the first threshold time $t_1$ is a time at which the concentration of intrinsic carrier of the amorphous silicon begins to keep thermal equilibrium, and the second threshold time $t_2$ is the latent period for nucleus generation during solid phase shift from amorphous silicon to polycrystalline silicon. Thus, according to the preheating time together with the preheating temperature, the a-Si thin film is converted into an a-Si thin film, an a-Si/Poly-Si thin film, or a Poly-Si thin film. Preferably, the preheating time of the a-Si thin film is continued over the second threshold time $t_2$ so as to increase electron mobility of the silicon thin film by at least partial crystallization as well as generate intrinsic carriers, thereby lowering an electric resistance of the silicon thin film further. However, the polycrystalline silicon made by crystallization in the preheating step has many crystal lattice defects such as twinning.

If an electric field is applied to the a-Si thin film, the a-Si/Poly-Si thin film, or the Poly-Si thin film, whose resistance value is lowered, Joule heating may be conducted thereon. If Joule heating is conducted within a relatively short time under a suitable condition, a temperature of the silicon thin film is increased in an instant, thereby causing phase shift from a solid phase to a liquid phase, or occasionally from a liquid phase to a solid phase, resultantly making crystals. At the same time, the crystal lattice defects such as twinning in the polycrystalline silicon made in the preheating step.

Such results are very similar to the crystallization method using ELC and SLS, which is a laser crystallization method capable of making a Poly-Si thin film of good quality, in the aspect that the process is completed within a very short time at a very high temperature. However, a method for crystallizing an a-Si thin film and an a-Si/Poly-Si thin film over the entire area of the substrate by means of selective Joule heating by field application and a method for conducting elimination of crystal lattice defect and promotion of crystal growth of a Poly-Si thin film over the entire area of the substrate are novel ways, which have never been reported.

In case of thermal treatment of a doped silicon thin film according to the method of the present invention, the silicon thin film may be a doped a-Si thin film, a doped a-Si/Poly-Si thin film or a doped Poly-Si thin film. When preheating such a doped silicon thin film, an extrinsic carrier is generated due to the dopant in addition to the intrinsic carrier. Thus, in this case, the applied electric field induces Joule heating by means of movement of the two kinds of these carriers.

The present invention also provides a Poly-Si thin film of good quality which is crystallized by the annealing method or a Poly-Si thin film in which a dopant is activated. While the laser crystallization method has the aforementioned problems since it conducts a local crystallization process, the method of the present invention may provide a Poly-Si thin film of good quality with a rapid crystallization and activation speed since the crystallization process is accomplished at one time over the entire area of the film to which the electric field is applied.

The annealing method and the Poly-Si thin film obtained by the method according to the present invention have the following advantages in comparison to the conventional technique.

First, the process for accomplishing crystallization is very simple and economically favorable. ELC, one of the latest techniques, scans line beams to be overlapped and SLS adopts a method of precisely moving a very short distance after irradiating laser through a patterned mask, so they take so long time to crystallize an entire substrate. However, the method of the present invention is capable of conducting crystallization and eliminating defects on an a-Si thin film, an a-Si/Poly-Si thin film or a Poly-Si thin film over the entire substrate within a very short time without any heat deflection of the substrate. Furthermore, ELC or the like is very complex unlike the method of the present invention, since it needs an additional dehydration annealing process for removing hydrogen from an a-Si thin film as a preprocess to irradiation of a laser. Meanwhile, though the conventional techniques such as MIC and MILC should deposit a catalyst metal thin film in order to promote crystallization, the method of the present invention does not require a catalyst metal deposition process for crystallization, so the method of the present invention is very simple and does not cause metallic contamination, in comparison to the conventional art.

Second, the present invention may be accomplished using inexpensive equipments and an existing technique already established. While ELC or the like, which gives excellent crystallization effects, requires very expensive equipments like a laser device, a preheating furnace or RTA necessary for the present invention is relatively cheap. In addition, the techniques for the method of the present invention are already well established in the semiconductor and flat display industries, so it is possible to use the conventional techniques as they are or through a little reorganization. In order to produce a uniform Poly-Si thin film by the method of the present invention, there may be needed stable power supply and time regulator for keeping a resistance value of the silicon thin film constant and applying an electric field. However, though the constant resistance of the silicon thin film may be seriously affected by the uniformity of a film thickness and a substrate temperature, the technique for forming an a-Si thin film with a uniform thickness is already perfected through PECVD, LPCVD and so on, and the thermal treatment may also be easily obtained since the temperature uniformity is already well established in the industry.

Third, the present invention is suitable for mass-production of Poly-Si thin films of good quality from a large-size substrate. According to the present invention, since the overall substrate is crystallized at once very rapidly, it is very advantageous for treatment of a large-sized substrate, and the Poly-Si thin films obtained may give crystallized materials of good quality without surface protrusions.

Fourth, the present invention may be used for a low temperature dopant activating process. The selective Joule heating by field application of the present invention may be effectively applied for thermal treatment of a dopant, to which ion is injected, near a source/drain electrode in TFT structure at a low temperature, as well as for crystallization.

Fifth, the present invention may have various applications. The crystallization method of the present invention may be used for not only a low temperature process below 650° C. but also a high temperature process which requires heating over 650° C. In addition, it may be employed in TFT elements used for LCD, an organic EL TFT element, a solar cell, and other products requiring selective Joule heating.

BRIEF DESCRIPTION OF THE DRAWINGS

Other objects and aspects of the present invention will become apparent from the following description of embodiments with reference to the accompanying drawing in which.

DESCRIPTION OF THE PREFERRED EMBODIMENT

Hereinafter, embodiments of the present invention will be described in more detail referring to the drawings, but they are not intended to limit the scope of the invention.

Figure 2:
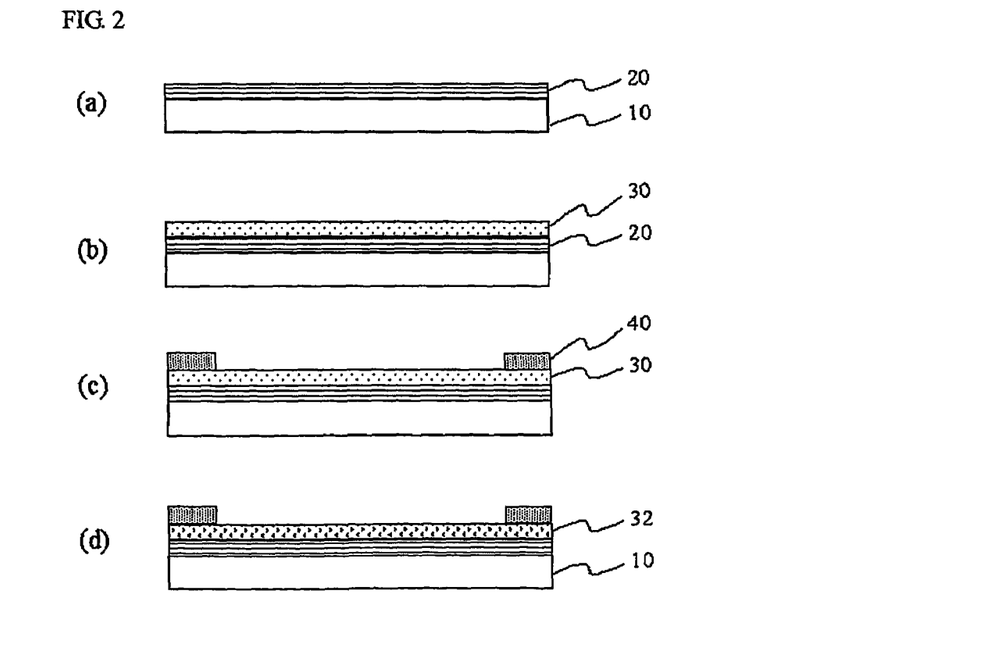
FIG. 2 is a schematic diagram for illustrating processes for making and preheating a test piece used for making a polycrystalline silicon (Poly-Si) thin film according to one embodiment of the present invention.

FIG. 2 is a schematic view showing the process of making a test piece for making a polycrystalline silicon (Poly-Si) thin film and preheating the test piece according to one embodiment of the present invention.

As shown in the step (a) of FIG. 2, an insulation layer 20 is formed on a substrate 10. The substrate 10 is made of a transparent material such as glass, quartz or plastic, without limitation, and glass is more preferred in an economic aspect. However, seeing the recent research trend in the flat display field, much research is in progress to develop a plastic material with excellent shock resistance and productivity, and the method of the present invention may be applied such a plastic substrate as it is. The insulation layer 20 is used for preventing liquidation of some substances in the substrate 10, for example alkali substances in case of a glass substrate, which may be generated in the following processes. The insulation layer 20 is commonly formed by deposition of silicon oxide ($SiO_2$), and its thickness is preferably in the range of 3000 to 5000 Å, without limitation. According to the technical development in the future, it might be possible that an amorphous silicon (a-Si) thin film is directly formed on the substrate without such an insulation layer 20, and this is no particular contradiction, so it should be understood that the aforementioned structure is also included in the scope of the present invention.

After that, in the step (b), an a-Si thin film 30 is formed upon the insulation layer 20. In order to form the a-Si thin film, there may be used PECVD (Plasma Enhanced Chemical Vapor Deposition), Sputtering, Vacuum Evaporation or the like, and PECVD is most preferred. For obtaining uniform crystallization in the Joule heating process afterward, it is required to keep a thickness of the a-Si thin film 30 uniform, and the thickness is commonly in the range of 300 to 1000 Å, without limitation.

Figure 6:
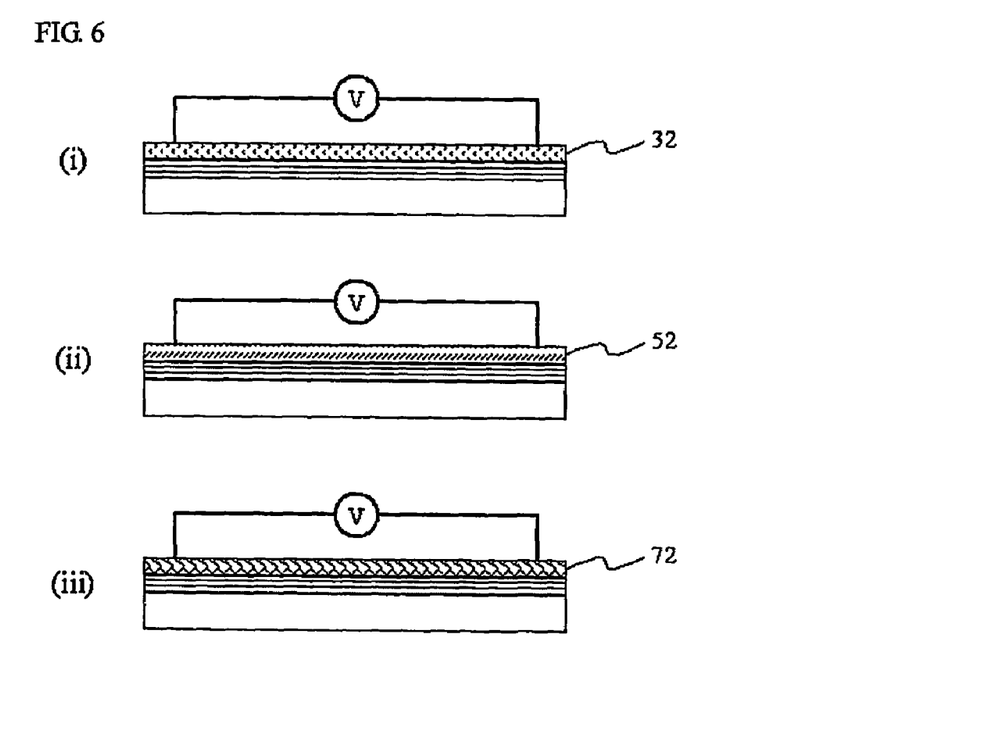

Subsequently, in the step (c), an electrode 40 is formed upon the a-Si thin film 30 formed as above. The kind of conductive materials to be used for the electrode 40 is not specially limited, but preferably a material with low resistance such as transparent electrode (e.g., indium tin oxide or indium zinc oxide) and nickel oxide is used in addition to metal and metal alloy. The electrode 40 is used for applying an electric field to the a-Si thin film 30, so it is also possible to apply an electrode field directly to the a-Si thin film 30 without forming the electrode 40 as shown in FIG. 6.

Subsequently, in the step (d), the a-Si thin film 30 formed as above is preheated at a temperature within a range not damaging the substrate 10 during the process. The 'temperature within a range not damaging the substrate during the process' is defined as a temperature range at which the substrate 10 is not damaged during the overall procedure including the preheating step and a following electric field application step. Such a temperature range is generally lower than a heat deflection temperature of the substrate 10. However, though a temperature of the silicon thin film 30 is higher than the heat deflection temperature of the substrate 10 during the process, a heat capacity actually transferred to the substrate 10 may be so low as not to cause heat deflection due to the fact that the process is progressed very quickly. Thus, the temperature range should be defined to include the above case. If the a-Si thin film 30 is preheated as above, an intrinsic carrier is generated, thereby lowering resistance and being made into a test piece which may undergo Joule heating.

The preheating method is not specifically limited, and there may be used i) a method of increasing temperature of the substrate 10, the insulation layer 20 and the a-Si thin film 30 in a general thermal treatment furnace; and ii) RTA (Rapid Thermal Annealing) for improving the a-Si thin film 30 in a relatively short time by irradiating radiant heat of such as a lamp to the front surface of the a-Si thin film 30.

If preheating at a certain temperature is kept up over the second threshold time $t_2$ in FIG. 1, solid crystallization happens partially or entirely. As a result, the extent of solid crystallization under such condition depends on a preheating time, and electron mobility of the silicon thin film is increased according to crystallization, and accordingly an electric resistance is further lowered. Thus, in the step (d), a silicon thin film 32 may exist in an amorphous state, amorphous/polycrystalline mixture state, or a polycrystalline state by means of the preheating. In this case, however, the polycrystalline state has many crystal defects.

Resultantly, the heating temperature should be determined in consideration of various factors such as a heat deflection temperature of the substrate, a thickness of the thin film and an amplitude of the applied electric field, and particularly setting a range of an initial resistance capable of conducting Joule heating may be required in the actual process. At first, considering inducement of stable Joule heating, an allowable uppermost resistance of the silicon thin film 32 by preheating is 10 MΩ/sq or less, preferably 1 MΩ/sq or less. If the resistance is higher than 10 MΩ/sq, concentration of the intrinsic carrier is too low, and a significantly higher voltage should be applied to induce Joule heating, so it may be not suitable for the actual process. Meanwhile, an allowable lowermost resistance of the a-Si thin film by preheating is directly influenced by the heat deflection temperature of the substrate 10. For example, in case a glass substrate generally used for a flat display is employed as the substrate 10, it is required that the preheating temperature does not exceed 800° C. which is a heat deflection temperature thereof. Thus, considering the allowable range of the thin film resistance, a heating temperature is preferably 200 to 800° C. in case a glass substrate is used as the substrate 10, more preferably 500 to 800° C.

However, as mentioned above, only the a-Si thin film 30 needs to be preheated, the process may be conducted within a very short time, and RTA may heat only the a-Si thin film 30 within a very short time. Thus, in case the crystallization is conducted by instantly heating only the a-Si thin film 30 at a relatively high temperature, it is also possible that the preheating temperature of the a-Si thin film 30 is higher than an intrinsic heat deflection temperature of the substrate 10 under the condition that the heat conducted through the insulation layer 20 does not increase a temperature of the substrate 10 over its heat deflection temperature during the process. In this case, though a glass substrate is used as the substrate 10, the preheating temperature of the a-Si thin film 30 may be increased even up to 900° C. This is possible because the crystallization method of the present invention may be accomplished within a very short time, like ELC.

Figure 3:
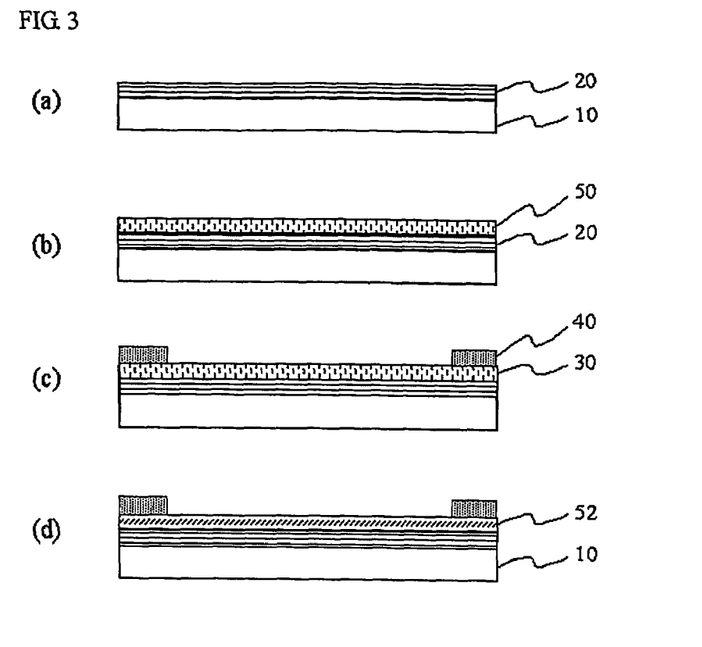
FIG. 3 is a schematic diagram for illustrating processes for making and preheating a doped test piece used for making a polycrystalline silicon (Poly-Si) thin film according to one embodiment of the present invention.

FIG. 3 is a schematic view showing the process of making a test piece for making a doped Poly-Si thin film and preheating the test piece according to another embodiment of the present invention.

In the step (a) of FIG. 3, an insulation layer 20 is formed on a substrate 10, like the step (a) of FIG. 2.

After that, in the step (b), a doped a-Si thin film 50 is formed upon the insulation layer 20. In order to form the doped a-Si thin film 50, there are preferably used the low-pressure deposition, the normal pressure deposition, and PECVD. Among them, PECVD is most preferred. For uniform crystallization in the following Joule heating, it is required to keep a thickness of the doped a-Si thin film 50 constant, and the thickness is preferably in the range of 300 to 1000 Å, without limitation.

Subsequently, in the step (c), an electrode 40 is formed upon the a-Si thin film 50 like the step (c) of FIG. 2, and this step may be excluded as mentioned above.

After that, the preheating step (d) is accomplished like the step (d) of FIG. 2. At this time, a dopant-originated extrinsic carrier is generated together with the intrinsic carrier in a preheated silicon thin film 52, thereby lowering a resistance further. Except the above description, this embodiment is identical to that of FIG. 2.

Figure 4:
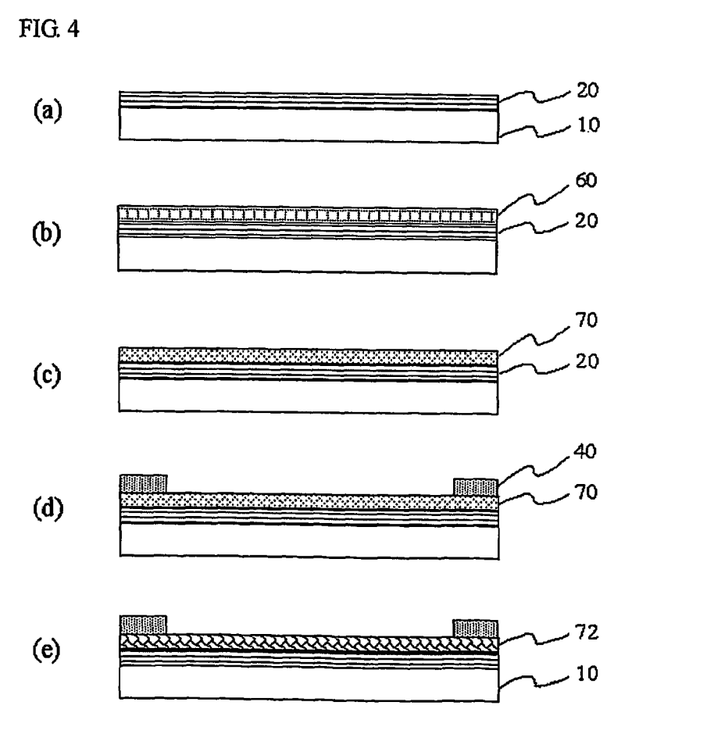
FIG. 4 is a schematic diagram for illustrating processes for making and preheating a test piece used for activating a dopant according to another embodiment of the present invention.

FIG. 4 is a schematic view showing the process of making a test piece for activating a dopant and preheating the test piece according to still another embodiment of the present invention.

In the step (a) of FIG. 4, an insulation layer 20 is formed upon a substrate 10, like the step (a) of FIG. 2.

After that, in the step (b), a Poly-Si thin film 60 is formed upon the insulation layer 20. For uniform crystallization in Joule heating, it is required to keep a thickness of the Poly-Si thin film 60 constant, and the thickness is preferably in the range of 300 to 1000 Å, without limitation.

In the step (c), a doped Poly-Si thin film 70 is made. For doping, Ion Injection or Ion Shower Doping may be used.

In the step (d), an electrode 40 is formed upon the doped Poly-Si thin film 70 like the step (c) of FIG. 2, and this step may be excluded as mentioned above.

In the step (e), preheating is accomplished like the step (d) of FIG. 2. At this time, a dopant-originated extrinsic carrier is generated together with the intrinsic carrier in a preheated silicon thin film 72, thereby lowering a resistance further. Except the above description, this embodiment is identical to that of FIG. 2.

Figure 5:
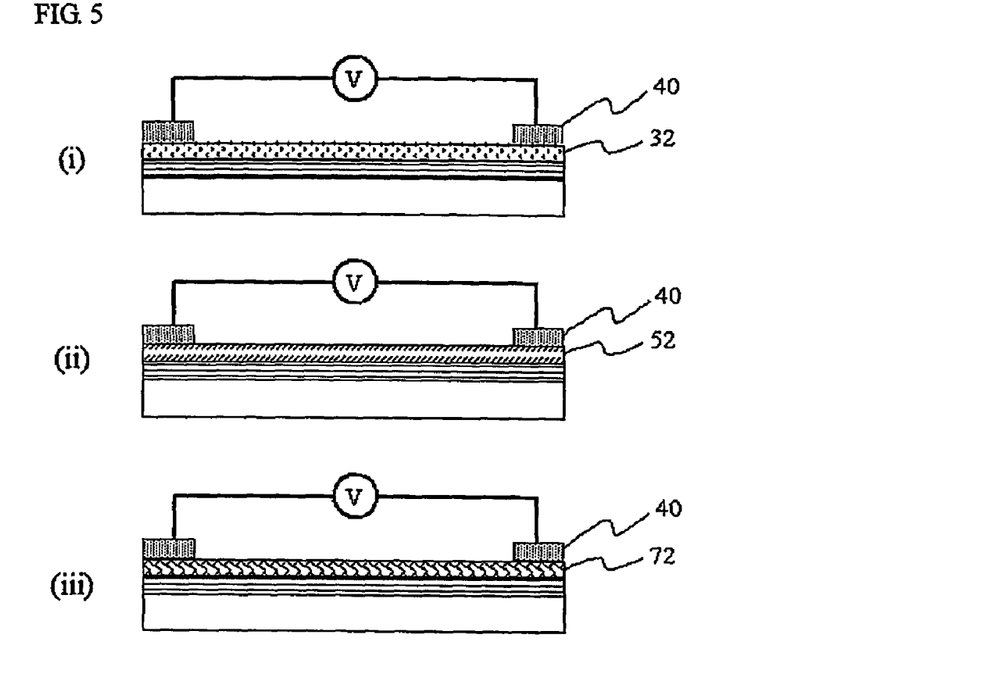
FIGS. 5 to 7 are schematic diagrams showing electric field applying manners according to embodiments of the present invention.
Figure 7:
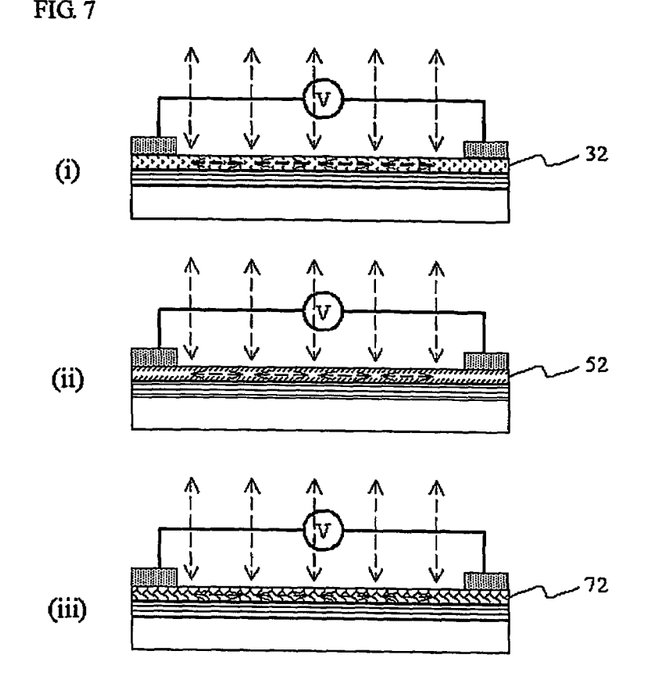

An electric field may be applied in various ways, and FIGS. 5 to 7 are schematic diagrams showing exemplary methods for applying an electric field to the test piece, which is respectively preheated in FIGS. 2 to 4.

At first, referring to FIG. 5, DC or AC electric field is applied to the electrode 40 of the silicon film 32, 52 or 72 of the test piece preheated in FIGS. 2 to 4. Such a field application method electrically configures a parallel circuit, so the applied voltage is applied to the substrate 10, the insulation layer 20, and the silicon thin film 32, 52 or 72 identically, and current flows toward a point with a lowest resistance. That is to say, the current flows to a silicon thin film 32, 52 or 72 which has the lowest resistance. Thus, an intrinsic carrier moves in the silicon thin film 32, and an intrinsic carrier and an extrinsic carrier move in the doped silicon thin film 52 or 72. For uniform crystallization and dopant activation, resistance of the silicon thin film 32, 52 or 72 should be kept uniform over the entire substrate uniformly before the electric field is applied, and for this, it is required to keep a thickness of the silicon thin film constant before preheating and make a temperature of the thin film uniform during preheating. If the resistance of the preheated silicon thin film 32, 52 or 72 is kept constant, voltage drop is caused linearly, so a constant electric field is applied to the entire thin film, thereby reaching a desired temperature uniformly by Joule heating.

As another method for applying an electric field, FIG. 6 shows a method for applying a DC or AC electric field while the silicon thin film 32, 52 or 72 to which an electrode is not formed is directly contacted with a wire (or, a metal electrode or the like). This connecting manner may be variously selected, and is not specifically limited.

As still another method for applying an electric field, FIG. 7 shows a method for applying an electric field E to the preheated silicon thin film 32, 52 or 72 and at the same time applying a magnetic field M to an upper portion thereof. In this case, the applied magnetic field M should change its orientation continuously in order to induce an electric field E, and the electric field E is preferably applied by giving an AC power so that it has orientation as similar to that of the electric field E induced by change of the magnetic field M as possible. At this time, an induced current induced by the magnetic field M and an AC current generated by the applied AC voltage are generated at the same time in the silicon thin film 32, 52 or 72. In addition, since two or more wavelengths are overlapped to cause interference, a maximum amplitude of energy applied by composition of the wavelengths may be increased.

Hereinbefore, several methods for conducting Joule heating by applying an electric field to the preheated silicon thin film 32, 52 or 72 are exemplarily described. However, other ways may be used if they may induce Joule heating by applying an electric field to the silicon thin film 32, 52 or 72 of which resistance is lowered by preheating. For example, a DC or AC current may be applied with metal electrodes being contacted to both ends of a preform composed of a substrate, an insulation layer and a silicon thin film, and it should be considered that such modifications are included in the scope of the invention.

An application time for one application of an electric field may be determined in consideration of various process factors, and it is very short, preferably as much as $10^{-6}$ to $10^3$ seconds, more preferably $10^{-4}$ to $10^2$ seconds. The electric field may be applied once, but also may be applied repeatedly at regular intervals.

One of the most important characteristics of the present invention is that crystallization of the a-Si thin film, the a-Si/Poly-Si thin film or the Poly-Si thin film is conducted by means of Joule heating by applying an electric field with a resistance being lowered by preheating. Though the conventional FALC or other crystallization methods arising therefrom also apply an electric field, these crystallization methods do not use selective Joule heating, thereby not passing through the preheating step. Thus, these crystallization methods are obviously distinguished from the method of the present invention in the point that a preform before crystallization is a pure amorphous silicon. In addition, the conventional crystallization mechanism using an electric field application method is directed to supporting a crystallization promoting process using metal by means of an electric field itself or supporting other effects induced by metal, not directed to Joule heating induced by supplying a large amount of current. Thus, it is obviously different from the present invention, which gives similar results to a laser crystallization method with passing through a solid phase shift at a high temperature by means of Joule heating. This may be easily found from the differences of shape of crystal grains, crystallization time and so on.

Figure 8:
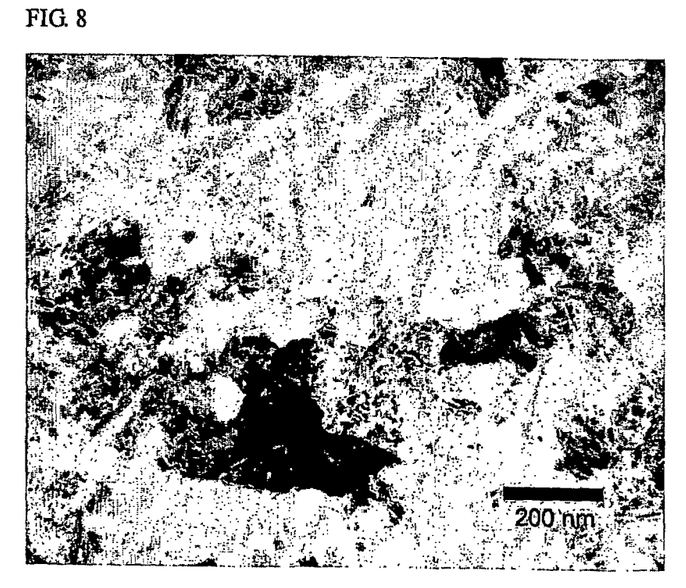
FIG. 8 is a TEM (Transmission Electron Microscope) photograph of a test piece in which an a-Si thin film is crystallized by annealing according to one embodiment of the present invention.
Figure 9:
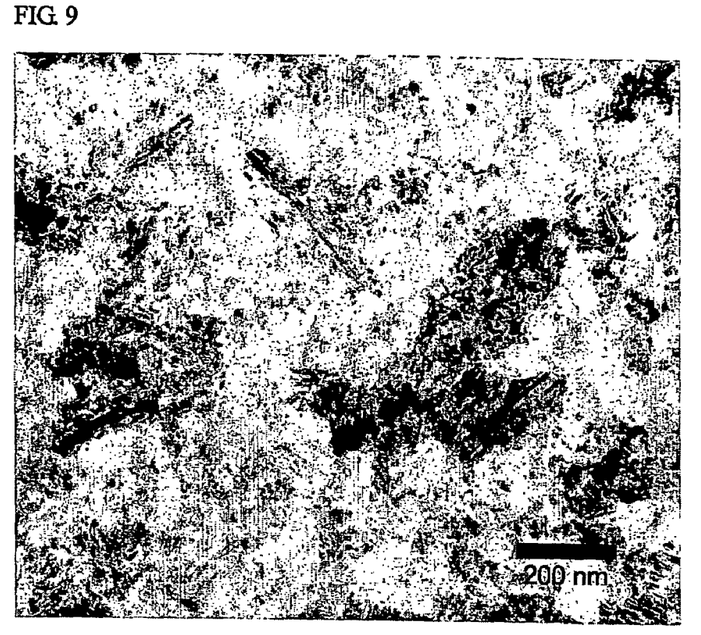
FIGS. 9 to 11 are TEM photographs of test pieces in which a-Si thin films are crystallized by conventional manners, namely SPC, MILC and ELC, respectively.
Figure 10:
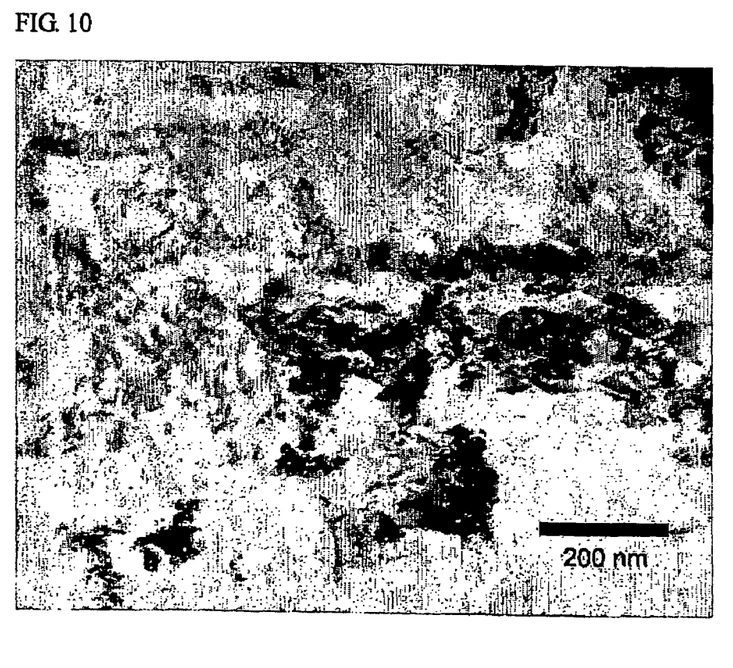
Figure 11:
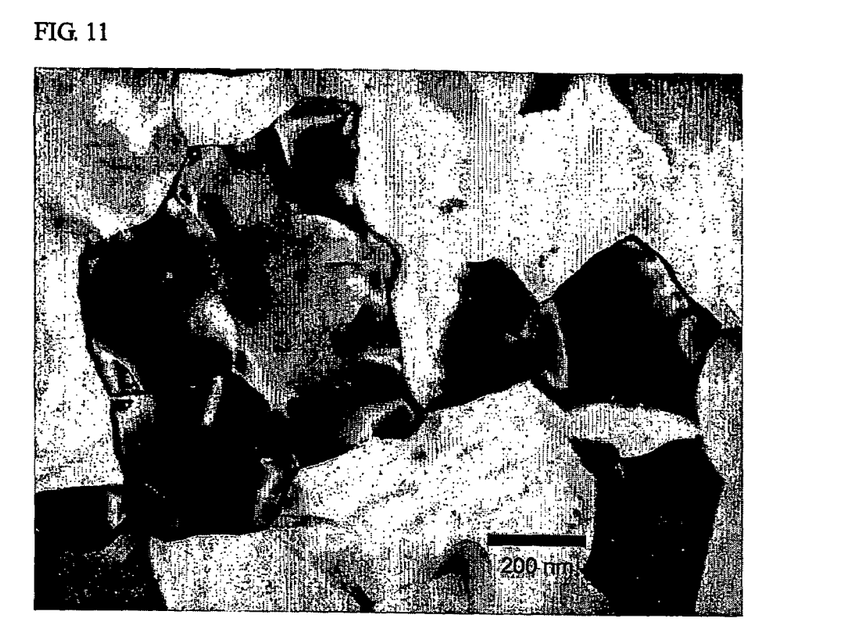

FIG. 8 is a TEM (Transmission Electron Microscope) photograph showing the silicon thin film obtained by the crystallization method according to the above embodiment, and FIGS. 9 to 11 show TEM photographs of silicon thin films crystallized by conventional SPC, MILC and ELC according to the prior art, respectively. When compared with the silicon thin film (see FIG. 9) of SPC and the silicon thin film (see FIG. 10) of MILC, it is found that the silicon thin film (see FIG. 8) crystallized by the method of the present invention is converted into a Poly-Si thin film with fewer defects and larger crystal grains. This reveals that the method of the present invention provides results of good quality similar to the silicon thin film of ELC (see FIG. 11), which is known to give better Poly-Si thin film than the conventional crystallization methods such as SPC and MICL, which results from characteristics of the present invention itself as compared with the conventional techniques.

Hereinafter, experimental facts supporting the crystallization mechanism of the present invention and their theoretical backgrounds are described.

Inventors first made an a-Si thin film and then measured resistance according to temperature. Since the a-Si thin film is transformed into a polycrystalline phase due to its thermodynamic characteristics as temperature is increased, the following resistance values show values of a pure amorphous state, an amorphous/polycrystalline phase or a polycrystalline phase as a measured temperature is increased. The measurement results are shown in the following table 1, and the measured resistance is a value of surface resistance of a silicon thin film with a thickness of 500 Å.

TABLE 1

| Temperature (° C.) | Resistance (kΩ) |
|---|---|
| 295.8 | 388600 |
| 312.4 | 186500 |
| 328.2 | 98600 |
| 344.8 | 56900 |
| 360.9 | 28200 |
| 377.2 | 20522 |
| 392.5 | 14205 |
| 409.1 | 10383 |
| 424 | 8407 |
| 439.5 | 7360 |
| 455.1 | 6417 |
| 471.2 | 5331 |
| 487.3 | 4314.5 |
| 504.3 | 3638.6 |
| 521.8 | 3061.2 |
| 536.9 | 2397.5 |
| 552.8 | 1810.6 |
| 569.4 | 1307.3 |
| 585.4 | 918.7 |
| 602.2 | 622.3 |
| 617.7 | 545.8 |
| 634.3 | 469.36 |
| 652.9 | 365.96 |
| 681.9 | 195.89 |
| 695.5 | 128.27 |
| 711.3 | 76.68 |
| 725.3 | 93.22 |
| 740.8 | 45.879 |
| 754.3 | 41.439 |

TABLE 1-continued

| Temperature (° C.) | Resistance (kΩ) |
|---|---|
| 768.3 | 38.91 |
| 782.3 | 35.608 |
| 794.5 | 27.312 |
| 799.5 | 31.57 |
| 808.3 | 30.311 |
| 831.2 | 28.133 |
| 846.4 | 24.907 |
| 855.6 | 23.519 |
| 867.8 | 21.715 |
| 875.3 | 21.864 |
| 889 | 20.978 |
| 899.1 | 20.757 |
| 903.7 | 19.167 |
| 919.9 | 17.794 |
| 928.8 | 16.577 |
| 936.5 | 16.347 |
| 942.5 | 11.862 |

Related to the above, the relation between temperature and resistance of the silicon thin film may be expressed by the following equation.

$$\ln R \propto \frac{1}{T}$$

In the above equation, R is a resistance of the silicon thin film, T is an absolute temperature, and ln is a natural log. Thus, as the temperature is increases, the resistance of the silicon thin film is lowered and Joule heating is possible at a suitable resistance. The term "Joule heating" is defined as heating using a heat generated by resistance while an electric current flows through a conductive material.

The energy per unit time, applied to the silicon thin film by means of Joule heating caused by application of an electric field, may be expressed by the following equation.

$$W = \frac{V^2}{R} = V^2 e^{\frac{T}{A}}$$

In this equation, W is an energy of Joule heating per unit time, V is a voltage applied to both ends of the silicon thin film, T is an absolute temperature, and A is an arbitrary constant.

In the above equation, it is found that the energy per unit time, applied to the silicon thin film by means of Joule heating, is increased as the voltage V is increased or the preheating temperature T is increased. If the temperature of the silicon thin film is increased by means of Joule heating, heat conduction occurs toward the insulation layer (e.g., $SiO_2$) and the substrate (e.g., a glass substrate) positioned below the silicon thin film. Thus, in order to selectively conduct Joule heating for increasing temperature of the silicon thin film without accompanying heat deflection of the glass substrate, the present invention applies a suitable voltage or current to the test piece during a very short time. If the applied energy is sufficient, the process may be completed with only one shot, while, if not sufficient, the crystallization process may be completed with several shots at suitable time intervals. In the following description, temperature increase of the silicon thin film by means of the selective Joule heating is calculated using a simple heat analysis modeling.

Figure 12:
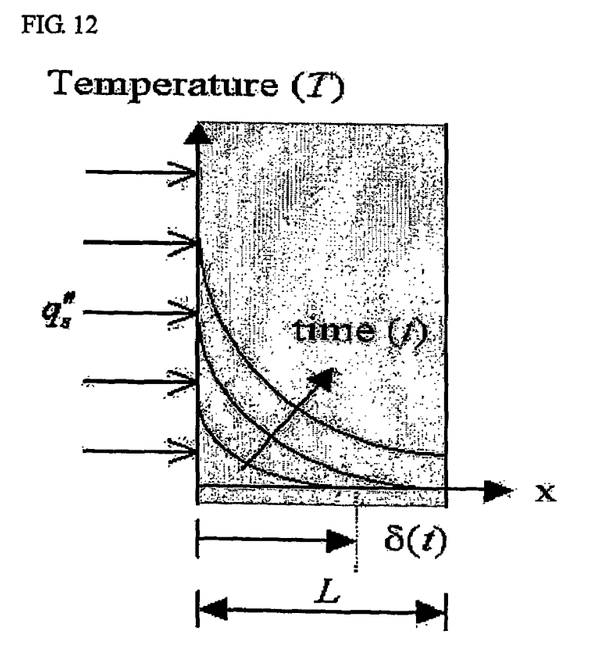
FIG. 12 is a graph showing thermal distribution calculation results in a thickness direction for a glass substrate, obtained by the heat diffusion equation.

For the heat analysis, it is assumed that 1-dimensional transient conduction {temperature T (t, x)} is changed in a thickness direction and uniform in a plane direction, which is very acceptable, except an electrode connection portion. In addition, it is also assumed that a heat conductivity k and a thermal diffusivity a are constant, which is very acceptable, since it allows only an error within 10% in the range of 650 to 900° C. in case of glass. In addition, it is also assumed that a radiant heat transfer is neglected and a heat flux is constant, which is acceptable on the condition that the preform is transparent and the temperature is below 900° C., though the radiant heat transfer may not be neglected when a temperature of the thin film reaches a melting point. A thermal diffusion equation satisfying such assumptions is expressed by the following equation. FIG. 12 shows a graph for the temperature distribution in a thickness direction in a glass substrate satisfying the boundary condition after calculating a solution of the following thermal diffusion equation by integration.

$$\frac{1}{\alpha}\frac{\partial T}{\partial t} = \frac{\partial^2 T}{\partial x^2}$$

The initial condition is as follows.

$T(o,x) = T_0 \text{(given)}$

The boundary condition is as follows.

$$-k\frac{\partial T(t, 0)}{\partial x} = q_s'' \text{(given)}, \quad \frac{\partial T(t, L)}{\partial x} = 0$$

In the condition d(t)<L, the following result may be obtained by integration, and a temperature distribution satisfying the boundary condition is as follows.

$$T(t, x) - T_0 = \frac{q_s'' \delta}{2k}\left(1 - \frac{x}{\delta}\right)^2$$

An integral of the thermal diffusion equation is as follows.

$$\frac{1}{\alpha}\frac{d}{dt}\int_0^\delta (T - T_0) = \left.\frac{\partial T}{\partial x}\right|_{x=L} - \left.\frac{\partial T}{\partial x}\right|_{x=0}$$

A thermal penetration thickness is as follows.

$$\frac{d(\delta^2)}{dt} = 6\alpha, \text{ or } \delta(t) = \sqrt{6\alpha t}$$

A thermal penetration time is as follows.

$$t_p = \frac{L^2}{6\alpha}$$

A surface temperature is as follows.

$$T_s(t) - T_0 = \frac{q_s''}{k}\sqrt{\frac{3}{2}\alpha t}$$

By using the above results, if a current of 200 mA applied to the test piece with a size of 2×2 cm together with a voltage of 2,000V is applied for 100 msec, a temperature increase of the silicon thin film is about 240K as shown below.

$$q_s'' = \frac{(2000 \text{ V})(0.2 \text{ A})}{(0.02 \times 0.02 \text{ m}^2)} = 1 \times 10^6 \text{ W/m}^2$$

$$\delta(0.1 \text{ s}) = \sqrt{6(7.47 \times 10^{-7} \text{ m}^2/\text{s})(0.1 \text{ s})}$$

$$= 6.7 \times 10^{-4} \text{ m} < 7 \times 10^{-4} \text{ m}$$

$$T_s(0.1 \text{ s}) - T_0 = \frac{(1 \times 10^6 \text{ W/m}^2)(6.7 \times 10^{-4} \text{ m})}{2(1.4 \text{ W/m·k})} = 240 \text{ K}$$

Under such conditions, it is found that the intensity of the electric field applied to the a-Si thin film according to the present invention is at least 10 V/cm, preferably at least 100 V/cm, and more preferably at least 1000 V/cm. If the intensity of the electric field applied to the a-Si thin film is too low, it is apt to be impossible to induce Joule heating for crystallization. Meanwhile, the upper limit of the intensity of electric field to be applied sets a range which does not cause arc arcing and damage to a substrate. The electric field may be induced by either DC power or AC power.

As described above, though an electric field or a magnetic field is applied to progress vertical inducement or side inducement of a catalyst metal rapidly at a low temperature in the conventional art such as MIC, MILC or other crystallization methods, none of them satisfies the above conditions, thereby not obtaining crystallization by means of Joule heating. That is to say, since an electric field is applied directly to an a-Si thin film at a low temperature without a preheating process at a relatively high temperature for obtaining the aforementioned resistance value, it is impossible to obtain an initial resistance value required for Joule heating. In addition, even though a very high electric field is applied to induce Joule heating at a very high resistance, it is found that arcs are generated instead of Joule heating under such a severe condition. Thus, it is important that a surface resistance of the initial thin film before an electric field is applied has the aforementioned value. In order to satisfy this initial resistance value, preheating for a predetermined time at a relatively high temperature not causing deflection of the substrate is required, and as a result the preform used for Joule heating may be selected from a pure amorphous phase, amorphous/polycrystalline phase and a polycrystalline phase as desired.

Another element to be contrasted with such methods is an application time of the electric field. An electric field application time according to the present invention is less than $10^3$ seconds, more specifically $10^{-6}$ to $10^3$ seconds when once applied, as mentioned above. A crystallization time is short because heat is generated due to movement of electrons in the silicon thin film and its heat capacity is relatively high since the thin film has a small volume. Thus, in order to control the time suitably, an electronic controller for controlling an application time of electric field is preferably provided. This crystallization method using high temperature phase shift during a very short crystallization time is very similar to ELC which applies an instant energy to an amorphous silicon during an extremely short time for crystallization by a fast heating process.

The inventors carried out experiments under the following conditions in order to check effects according to the present invention.

EXAMPLE 1

$SiO_2$ insulation layer with a thickness of 3000 Å was formed on a glass substrate of 2 cm×2 cm×0.7 mm (length× width×thickness) by means of PECVD. An a-Si thin film with a thickness of 500 Å was formed again upon the insulation layer by means of PECVD, thereby preparing a test piece. The a-Si thin film formed as mentioned above was preheated in a tube furnace at about 650° C. for about 30 minutes under nitrogen atmosphere. After the preheating step and before applying an electric field, the a-Si thin film already experienced solid crystallization and contained partially polycrystalline phase, and a surface resistance of the thin film was about 35 kΩ. After the resistance of the silicon thin film was sufficiently lowered by means of such preheating, a DC electric field of 1,500 V/cm was applied so that a current of 250 mA flowed for 0.07 seconds, and then an electric field was applied again at a time interval of about 2.5 second to induce selective Joule heating in the silicon thin film. Electric fields were applied about 70 times in such a way.

Figure 13:
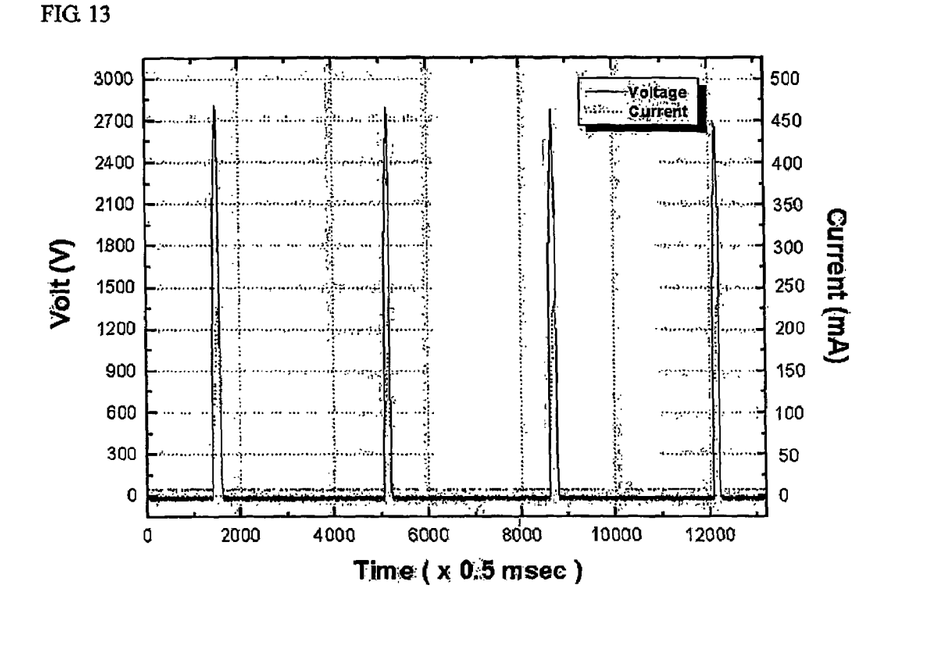
FIG. 13 is a graph showing changes of voltage and current according to a time applied to the silicon thin film in a first embodiment of the present invention.
Figure 14:
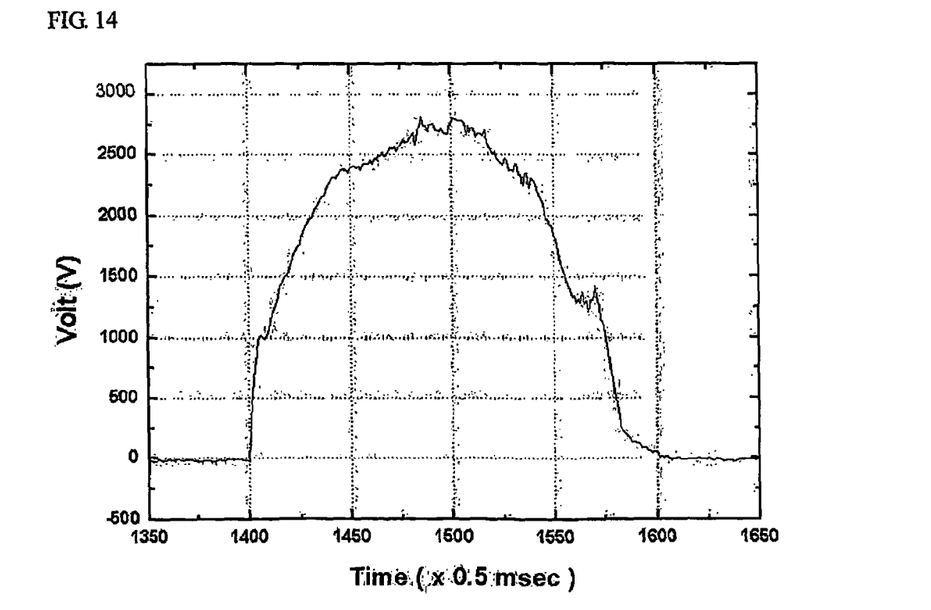
FIGS. 14 to 17 are graphs respectively showing changes of voltage, current, resistance and energy per unit time according to the time applied to the silicon thin film in 1 shot of the graph of FIG. 13.
Figure 15:
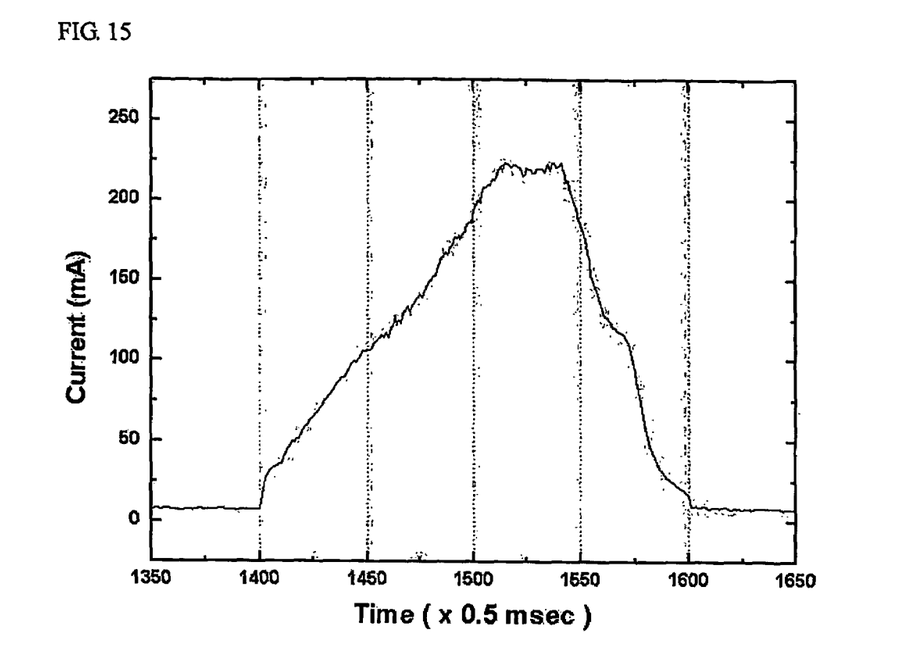
Figure 16:
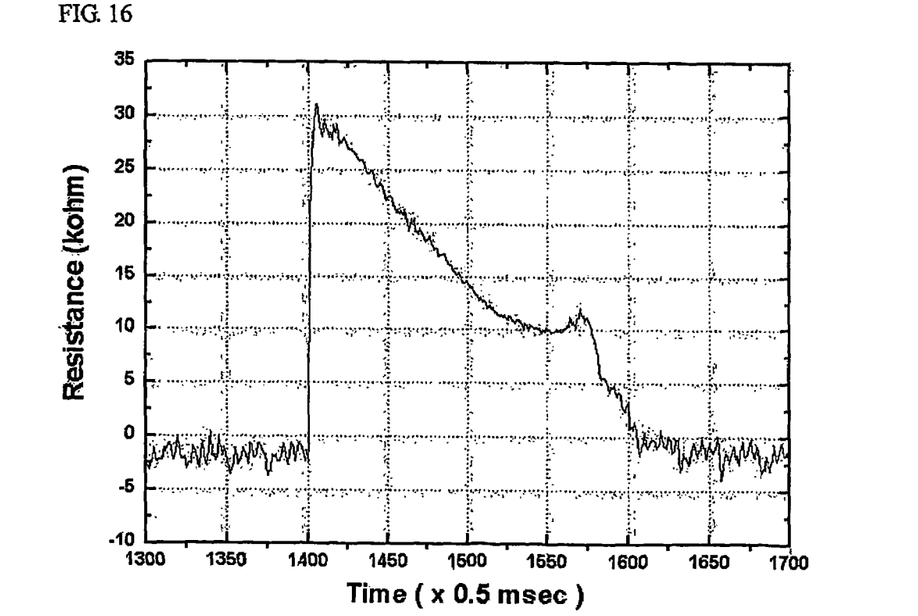
Figure 17:
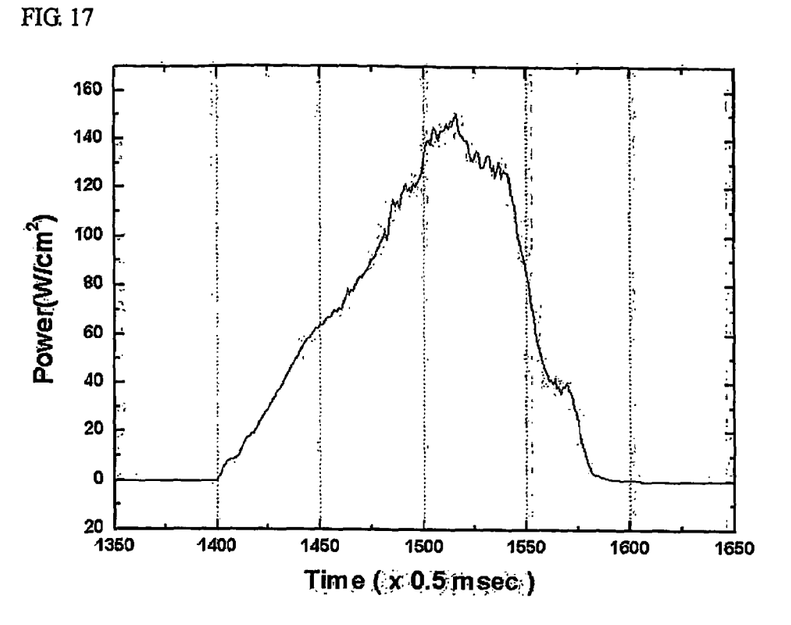

FIG. 13 shows changes of voltage and current according to the time applied to the silicon thin film. In addition, FIGS. 14 to 17 respectively show the change of energy to voltage, current, resistance and unit time according to the time applied to the silicon thin film at one shot. As shown in FIG. 16, it is found that the resistance of the thin film is decreased as soon as an electric field is applied. This means that Joule heating happens together with application of the electric field, so the temperature of the silicon thin film is increased, thereby lowering the resistance. In addition, as shown in FIGS. 14 and 15, it is found that, when a voltage is raised up to about 3,000 V, a maximum current flowing through the thin film approaches about 220 mA. The power at this time is about 140 W/cm² as shown in FIG. 17.

The glass substrate of the test piece annealed according to the method of the present invention kept its original flatness, and it was found that the a-Si thin film is converted into a Poly-Si thin film of good quality as shown in the TEM photograph of FIG. 8. In addition, crystal growth and lattice defect elimination were also significantly progressed, and it was found that the crystal grain is changed into a hexagonal shape by means of polygonization, instead of a leaf shape. A size of the crystal grain was about 3,000 to 5,000 Å, and a crystal lattice defect such as twinning was not found in the crystal grain.

Figure 18:
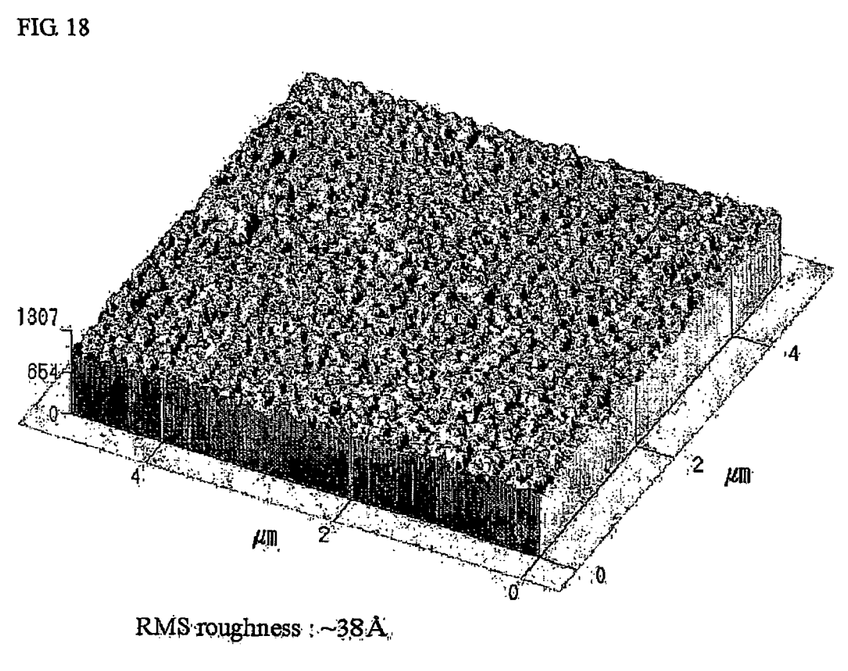
FIG. 18 is an AFM (atomic force microscopy) photograph of a Poly-Si thin film manufactured in the first embodiment of the present invention.

In addition, FIG. 18 shows a result of AFM (Atomic Force Microscopy) for quantification of surface roughness of the Poly-Si silicon thin film. From the AFM result, it was found that the surface roughness of the Poly-Si thin film prepared according to the experimental condition is about 37 Å.

COMPARATIVE EXAMPLE 1

The comparative example 1 was conducted in the same way as the Example 1, except that an a-Si thin film was solid-crystallized at 650° C. for one hour without application of an electric field. A TEM photograph of a Poly-Si thin film obtained as above is shown in FIG. 9. As shown in FIG. 9, the polycrystalline silicon prepared by SPC has a dendrite structure with a shape of branches of a tree, and it was found that it contains a lot of crystal lattice defects such as twinning in the crystal grain. This shows significant difference to the polycrystalline silicon of the Example 1.

COMPARATIVE EXAMPLE 2

Figure 19:
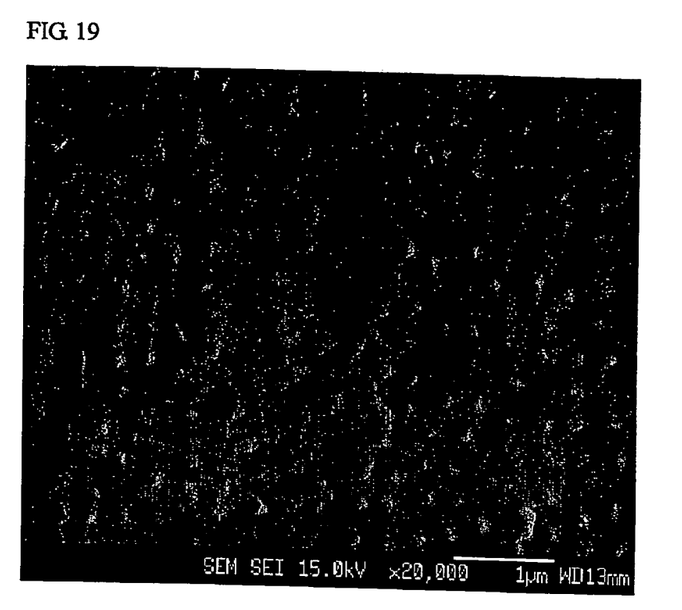
FIGS. 19 and 20 are an SEM photograph and an AFM photograph of a Poly-Si thin film manufactured by ELC in a comparative example 2.
Figure 20:
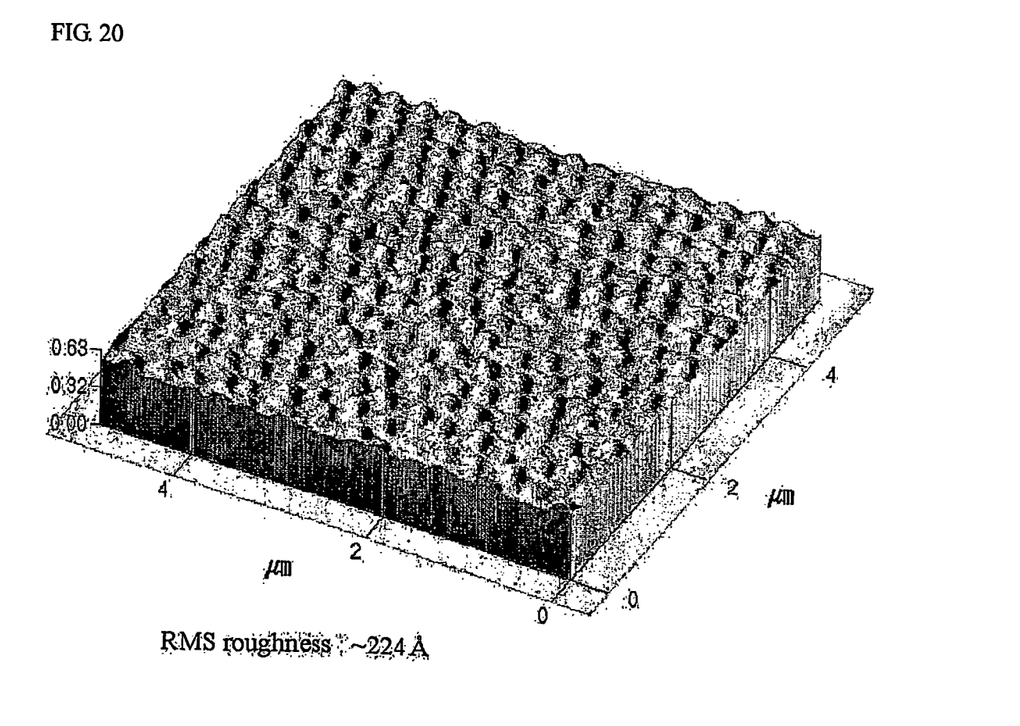

Crystallization was conducted using the same test piece as the Example 1 by means of MILC and ELC respectively according to the prior art. The results are shown in FIGS. 10 and 11 respectively. As shown in FIG. 10, a polycrystalline silicon prepared by MILC shows micro structure by side growth. In addition, as shown in FIG. 11, a polycrystalline silicon prepared by ELC shows micro structure with a hexagonal shape substantially having no defect, and a size of the crystal grain is about 2,000 to 4,000 Å. However, as shown in a TEM photograph of FIG. 19, in case of the polycrystalline silicon prepared by ELC, surface protrusion was found in the triple junction where crystal grains are collided with each other. FIG. 20 shows a result of AFM, and the surface roughness of the polycrystalline silicon prepared by ELC was about 224 Å.

EXAMPLE 2

$SiO_2$ insulation layer with a thickness of 3000 Å was formed on a glass substrate of 2 cm×1 cm×0.7 mm (length× width×thickness) by means of PECVD. An a-Si thin film with a thickness of 500 Å was formed again upon the insulation layer by means of PECVD, thereby preparing a test piece. The a-Si thin film formed as mentioned above was crystallized into a Poly-Si thin film by means of a laser crystallization method, and then the Poly-Si thin film is doped by ion shower with the use of $PH_3/H_2$ mixture gas. For the low temperature dopant activation of the test piece to which ion is injected, after preheating at 250° C. for about 20 minutes, a DC electric field of 1,000 V/cm is applied. Except that, the experiment was conducted in the same way as the Example 1. The glass substrate of the test piece treated as mentioned above kept its original flatness without deflection, and a surface resistance of the Poly-Si thin film to which an electric field was applied and then ion was injected was less than 1 kΩ/sq. It means that the thermal treatment for dopant activation happened at a low temperature.

APPLICABILITY TO THE INDUSTRY

As described above, the annealing method according to the present invention does not induce thermal deflection of the glass substrate, gives an angled crystal grain shape instead of a dendrite structure having a shape of tree branches shown in a Poly-Si thin film prepared by solid crystallization, makes substantially no crystal lattice defect such as twinning in the crystal grain, is completely free from contamination of a catalyst metal shown in a Poly-Si thin film prepared by a crystallization method such as MIC and MILC, and does not accompany surface protrusion shown in a Poly-Si thin film prepared by ELC. These characteristics are peculiar to the present invention, not shown in the conventional art.

Various modifications and applications on the basis of the above description will be possible to those ordinarily skilled in the art.

What is claimed is:

1. A method for annealing a silicon thin film in a substrate in which an insulation layer and the silicon thin film are subsequently formed, comprising:

heating or preheating the silicon thin film within a temperature range at which the substrate is not transformed during the process so as to generate an intrinsic carrier therein, thereby lowering a resistance to a value at which Joule heating is possible; and applying an electric field to the preheated silicon thin film so as to induce Joule heating by means of movement of the carrier, thereby conducting crystallization, eliminating crystal defects, and ensuring crystal growth, wherein an applying time of the electric field is in the range of $10^{-6}$ and $10^3$ second.

2. The method according to claim 1, wherein the substrate is a glass substrate or a plastic substrate.

3. The method according to claim 1, wherein the silicon thin film exists in an amorphous state, amorphous/polycrystalline mixture state, or a polycrystalline state by means of the preheating.

4. The method according to claim 1, wherein the substrate is a glass substrate and the preheating step is conducted at 200 to 800° C.

5. The method according to claim 1, wherein the preheating step is conducted over a threshold time at which solid phase crystallization of the silicon thin film is initiated.

6. The method according to claim 1, wherein an amorphous silicon thin film, an amorphous/polycrystalline silicon thin film, or a polycrystalline silicon thin film is crystallized by means of the annealing.

7. The method according to claim 1, wherein a doped amorphous silicon thin film, a doped amorphous/polycrystalline silicon thin film, or a doped polycrystalline silicon thin film is crystallized and a dopant is activated by means of the annealing.

8. The method according to claim 1, wherein a resistance of the silicon thin film is lowered below 10 MΩ/sq by means of the preheating.

9. The method according to claim 8, wherein the resistance is lowered below 1 MΩ/sq.

10. The method according to claim 1, wherein the electric field applied to the silicon thin film has an intensity of 10 V/cm or more.

11. The method according to claim 10, wherein the intensity of the electric field is more than 10 V/cm.

12. The method according to claim 1, wherein, when applying the electric field, DC or AC electric field is applied by depositing a metal electrode on a part of an upper surface of the silicon thin film, or DC or AC electric field is directly applied to the upper surface of the silicon thin film without depositing a metal electrode, or a magnetic field is applied to the silicon thin field together with the electric film.

13. A polycrystalline silicon thin film manufactured by the method defined in claim 1, which has a large crystal grain size and substantially no surface protrusion or crystal defect.

* * * * *